United States Patent
Tanaka

(10) Patent No.: US 6,477,615 B1
(45) Date of Patent: Nov. 5, 2002

(54) DETECTING CIRCUIT AND DETECTING METHOD OF IDLE WORD FOR CONTENT ADDRESSABLE MEMORY

(75) Inventor: Masahiro Tanaka, Moriyama (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/491,260

(22) Filed: Jan. 26, 2000

(30) Foreign Application Priority Data

Feb. 1, 1999 (JP) ............................................. 11-023602

(51) Int. Cl.⁷ ........................... G06F 12/02; G11C 15/04
(52) U.S. Cl. ........................................... 711/108; 365/49
(58) Field of Search ................................ 711/108, 128, 711/144, 156; 365/49

(56) References Cited

U.S. PATENT DOCUMENTS

| | | | | |
|---|---|---|---|---|
| 5,440,715 A | * | 8/1995 | Wyland | 711/108 |
| 5,813,040 A | * | 9/1998 | Rathke | 711/156 |
| 5,978,245 A | * | 11/1999 | Hata et al. | 365/49 |
| 5,999,434 A | * | 12/1999 | Yoneda et al. | 365/49 |
| 6,070,223 A | * | 5/2000 | Yoshizawa et al. | 711/108 |
| 6,199,140 B1 | * | 3/2001 | Srinivasan et al. | 711/108 |
| 6,219,748 B1 | * | 4/2001 | Srinivasan et al. | 711/108 |

OTHER PUBLICATIONS

Odagiri et al., "A New CAM for 622 Mbps ATM Cell Processing", IEEE 1996 Custom Integrated Circuits Conference.*

* cited by examiner

*Primary Examiner*—Gary J Portka
(74) *Attorney, Agent, or Firm*—Robert A. Walsh

(57) ABSTRACT

In a CAM having valid cells, an idle word is detected and outputted by using the data in the valid cells and an address encoder.

A detection circuit of an idle word for a content addressed memory having valid cells 15, which includes a unit 19 for supplying the output (valid 16) of the valid cell 15 to an address encoder 18 in response to an idle word detection signal IWD.

9 Claims, 5 Drawing Sheets

DETECTING CIRCUIT AND DETECTING METHOD OF IDLE WORD FOR CONTENT ADDRESSABLE MEMORY

FIELD OF THE INVENTION

The present invention relates to a content addressed memory (CAM), and more specifically to a detecting circuit and a detecting method of an idle word having no data to be retrieved in a CAM having valid cells.

BACKGROUND OF THE INVENTION

The content addressed memory (CAM) is a semiconductor memory in which by adding a data retrieving device to the semiconductor memory, whether or not data matching the inputted retrieval data exists in the memory is detected, in addition to the normal data read/write operation, and if there is matching data, the address of it is outputted, otherwise the absence of such data is outputted. The typical CAM comprises, as shown in FIG. 1, an address/data circuit (bus) 1, an input-output/control circuit 2, and a plurality of memory blocks 3.

FIG. 2 is a diagram showing the memory block 3 of the conventional CAM. The memory block 3 includes an address decoder 10, a data write driver 11, a data read sense amplifier 12, and a CAM cell array 13, which are seen in the typical memory, and in addition, includes a data retrieve driver 11, word match lines 14, valid cells 15, valid 16, a word match circuit 17, and an address encoder 18. Since the data retrieve driver can also be used as the data write driver, it is denoted by the same symbol 11 in FIG. 2, and has a function of sending retrieval data to the bit line of the cell array when data is retrieved. The valid cells 15 are a memory cell existing for each word address. The valid cell 15 is a memory which holds "false" (bit "0") if data is not written in its word address, and holds "true" (bit "1") that is written if data is written.

To the word match lines 14, the result of the comparison between the retrieval data and the data in the memory cell for each word address, which is made when data retrieval is performed, is outputted. The word match circuit 17 is connected to the CAM cell array 13 through the word match lines 14. The word match circuit 17 is a circuit which determines and outputs the presence or absence of matched data upon receipt of the valid 16, which is the output of the word match line 14 and the valid cells 15. The address encoder 18 receives the output of the word match circuit 17, assigns specified weight to it, and creates and outputs an address. The assigning of a specified weight means, for instance, increasing the priority of a low address.

Now, the operation of the CAM of FIG. 2 will be described. FIG. 3 is a diagram for explaining the data flow in the CAM. In FIG. 3, at the word address 0 to address 6 of the CAM cell array, the shown seven data are stored. In the valid cells for the word addresses 0, 1, 3, 5, and 6, a bit "1" showing the presence of data to be retrieved is stored. Further, the valid cells for the word addresses 2 and 4 have stored therein a bit "0" showing the absence of data to be retrieved (data is invalid), in other words, showing that data is not written yet, or data has become invalid after written.

Now, suppose that retrieval data shown by a symbol 20 in FIG. 3 is inputted by the data retrieve driver 11 (FIG. 2). To the word match lines 14, the results of the comparisons made between the retrieval data and the memory cells for the respective word addresses in the data retrieval are outputted. Upon receipt of the valid 16 which is the output of the word match line 14 and the valid cells 15, the word match circuit 17 detects the presence or absence of matched data and provides an output. If there is a match between the retrieval data and the data in the cell, it outputs a bit "0." Inversely, if there is no match between the retrieval data 20 and the data in the cell, it outputs a bit "1." In the example of FIG. 3, data are matching at the word addresses 1, 2, and 6. However, for the address 2, since there is a bit "0" in the valid cell, the output of the word match circuit is "1." Accordingly, only the word match outputs for the addresses 1 and 6 are "0," and the remaining addresses are "1."

The address encoder 18 receives the output of the word match circuit 17, and outputs the smallest address. In the example of FIG. 3, it outputs the smaller address 1 of the two matching addresses, addresses 1 and 6. Simultaneously, it outputs "true" as the match output.

SUMMARY OF THE INVENTION

There are the following problems with the conventional CAM described using FIGS. 1 to 3.

(1) It is not clear whether or not the CAM has an "empty address" (idle word) in which no data is written.

(2) It is not clear which address of the CAM is an "empty address."

(3) To solve the problems (1) and (2), to know the presence or absence of an "empty address" (idle word), and if there is an "empty address" (idle word), to know that address, it is necessary to provide a new circuit outside the CAM.

The present invention was made to solve the above problems of the CAM. Its object is to enable the knowing of the presence or absence of an "empty address" in the CAM, and knowing of the particular address if there is an "empty address."

It is an object of the present invention to enable the knowing of the presence or absence of an idle word and the word address of the idle word if it is present, without providing a new circuit outside the CAM.

It is an object of the present invention that, in the CAM having valid cells, the data in the valid cells and an address encoder are used to enable an idle word to be detected and outputted.

In accordance with the invention, a detection circuit of an idle word for a content addressed memory having valid cells is provided, which comprises means for supplying the output of a valid cell to an address encoder in response to an idle word detection signal.

In accordance with the invention, a content addressed memory (CAM) is provided, which comprises CAM cells, valid cells, word match lines, a word match circuit, an address encoder, a circuit for detecting an idle word by using the output of valid cells.

In accordance with the invention, a detection method of an idle word for a content addressed memory having valid cells is provided, which comprises a step of writing bit data representing the presence or absence of valid data to a valid cell, and a step of outputting the bit data of a valid cell to an address encoder in response to an idle word detection signal.

DESCRIPTION OF THE PREFERRED EMBODIMENT

Figure 3:
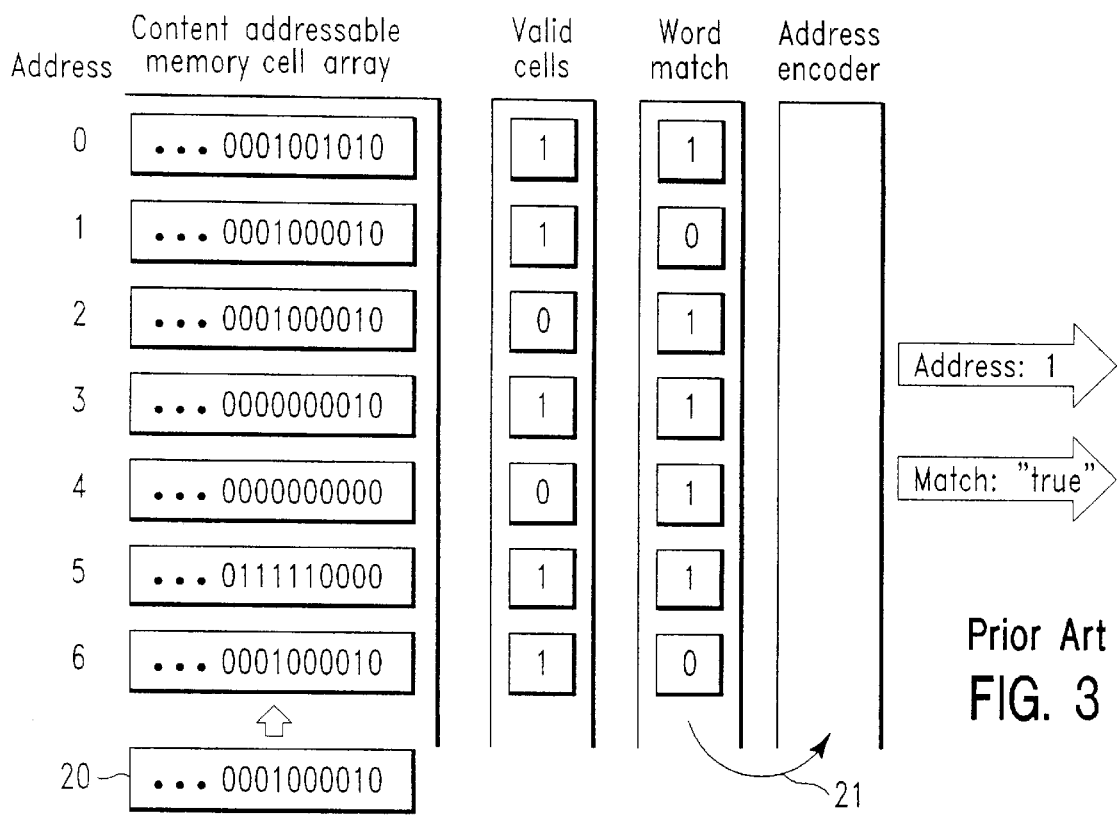
FIG. 3 is a diagram for explaining a data flow in the conventional CAM.
Figure 4:
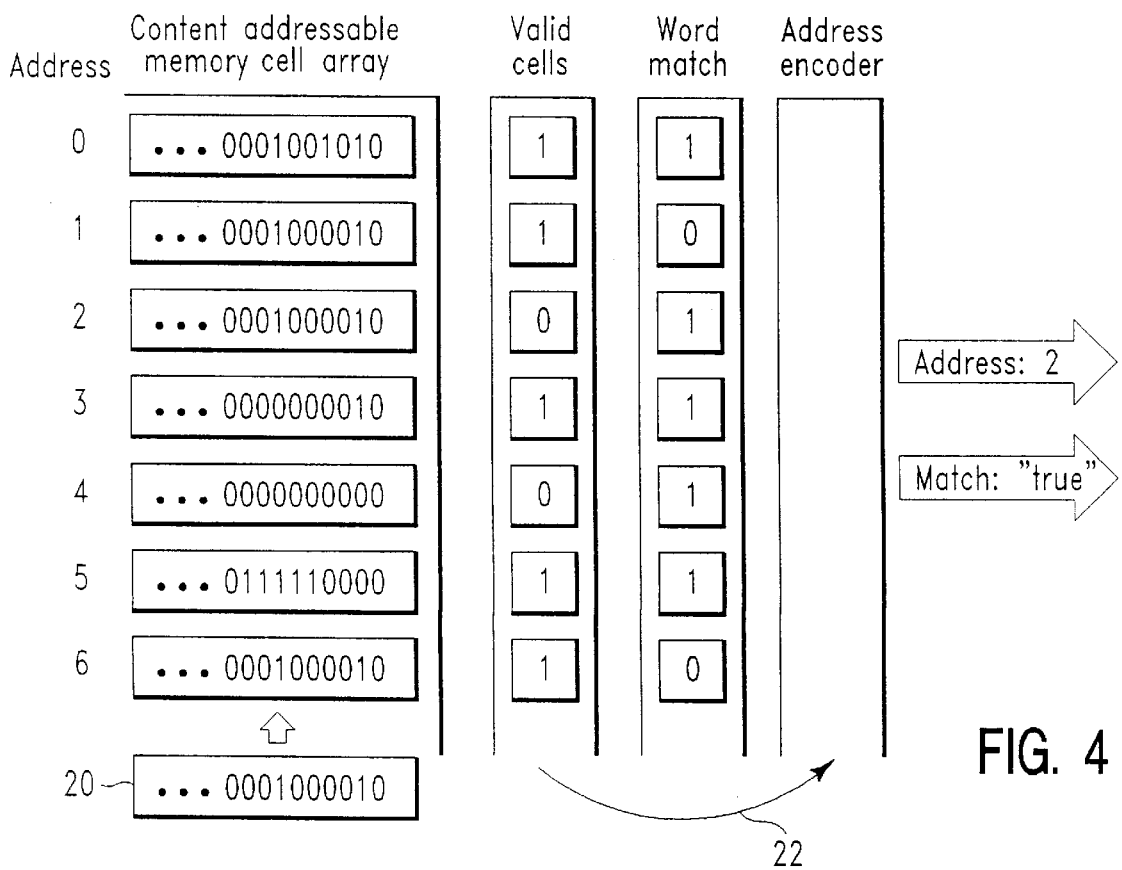
FIG. 4 is a diagram conceptually showing a detection method of an idle word related to the present invention.

The embodiments of the present invention will be described in detail with reference to the drawings. FIG. 4 is a diagram for conceptually showing the detection method of an idle word related to the present invention. FIG. 4 is the same as FIG. 3 except for an arrow 22. In a word, the present invention is such that, valid cells are put into focus, and the data in valid cells are used to detect an empty address (idle word). That is, conceptually, as shown by the arrow 22 in FIG. 4, the data in valid cells are passed to the address encoder to detect an idle word.

In the example of FIG. 4, in the word addresses 2 and 4 of valid cells, a bit "0" is stored, showing that data to be retrieved is not present (data is invalid), in other words, data is not written yet, or it becomes invalid after written. The address encoder receives the data in the addresses 2 and 4 of valid cells, and outputs the address 2 that is the smallest address. Simultaneously, the address encoder outputs "true" as a match output.

Figure 1:
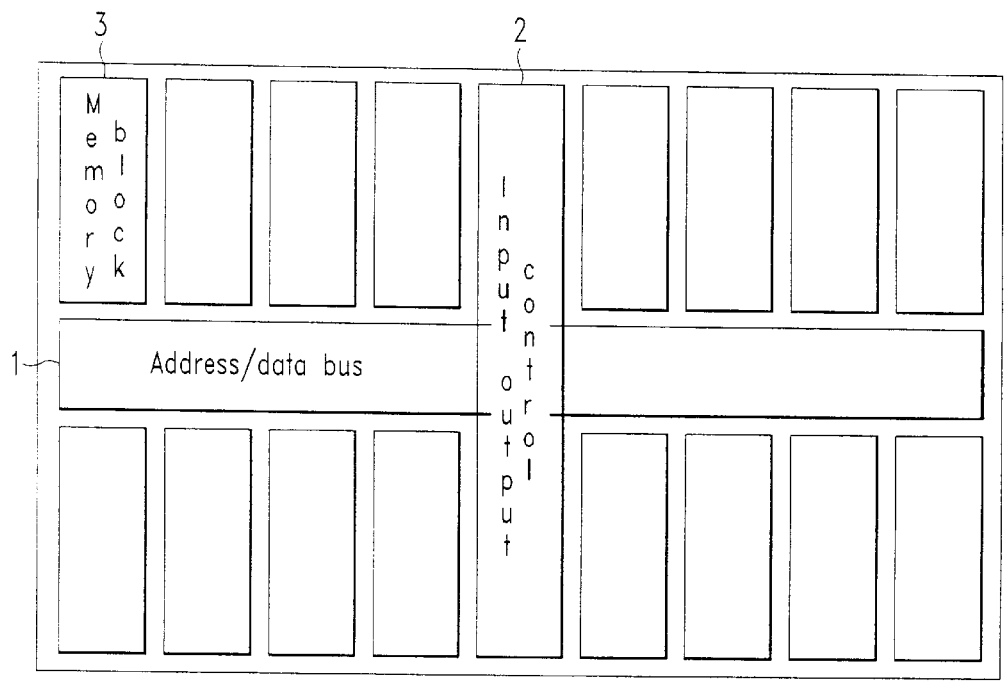
FIG. 1 is a diagram showing an configuration example of the typical CAM.
Figure 2:
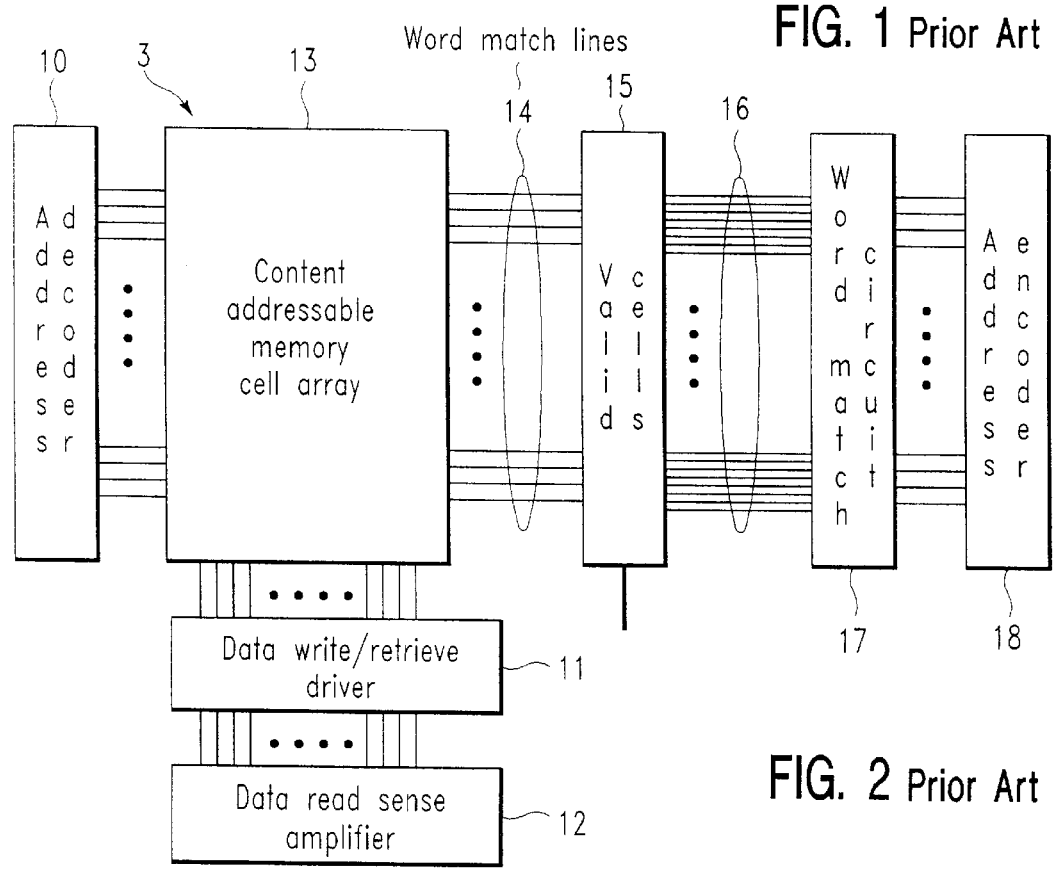
FIG. 2 is a diagram showing a memory block of the conventional CAM.
Figure 5:
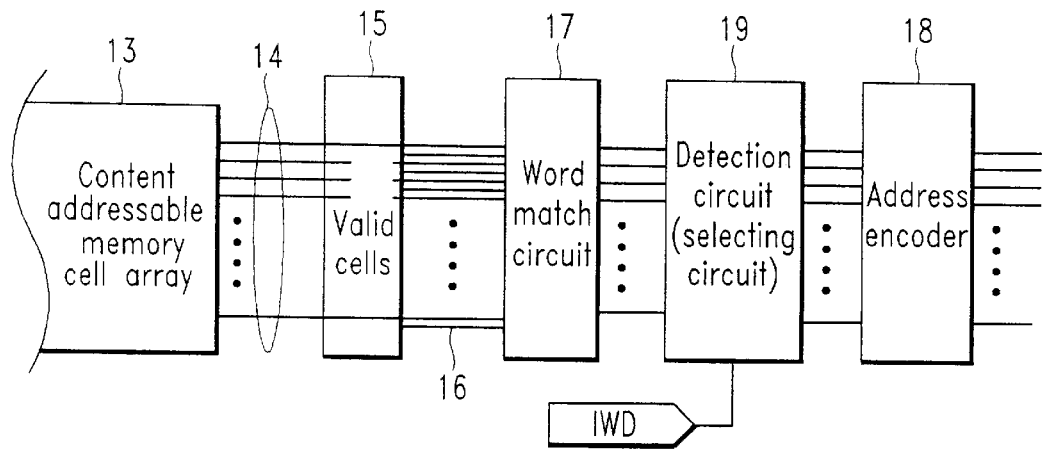
FIG. 5 is a diagram showing the CAM (first example) including a detection circuit of an idle word of the present invention.
Figure 6:
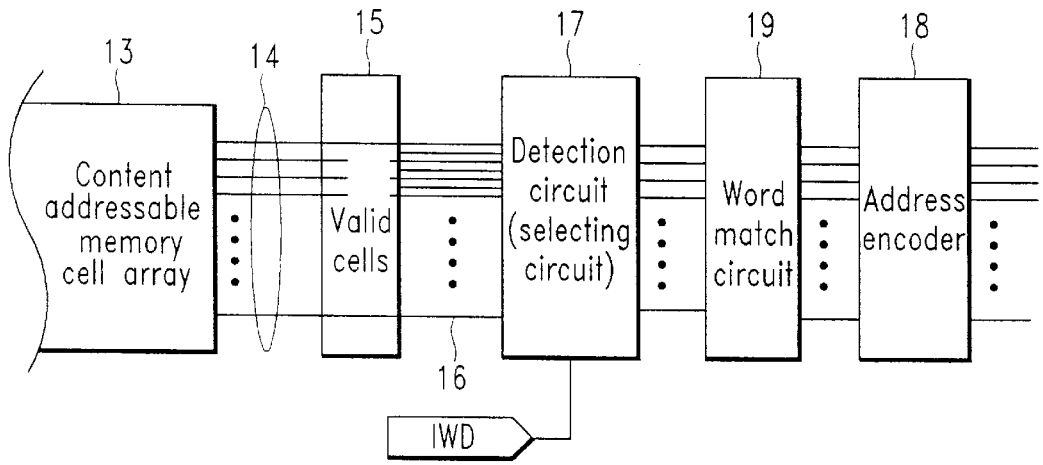
FIG. 6 is a diagram showing the CAM (second example) including the detection circuit of an idle word of the present invention.

FIGS. 5 and 6 are diagrams specifically representing the concept of the present invention shown in FIG. 4. FIGS. 5 and 6 are diagrams showing the configuration from the CAM cell array 13 to the address encoder 18 of the CAM of the present invention. The remaining configuration of the CAM (address decoder 10, driver 11, and sense amplifier 12) is the same as the prior art example of FIG. 2.

In the first example in FIG. 5, the detection circuit (selecting circuit) 19 of an idle word of the present invention is placed before the input of the address encoder 18. And, using the idle word detection signal (IWD) as a control signal, the valid 16 (idle word retrieval output), which is the output of the valid cell 15, and the output of the word match circuit 17 (data retrieval output) are switched and outputted to the address encoder 18. The idle word detection signal (IWD) may be generated as a new signal, but, if the address of an idle word is always outputted during operations other than the data retrieval operation, the data retrieval signal can be used as the idle word detection signal (IWD). In addition, although the detection circuit (selecting circuit) 19 is shown as an independent circuit in FIG. 5, it may be integrated into the address encoder 18.

On the other hand, the second example in FIG. 6 is a method in which the detection circuit (selecting circuit) 19 of an idle word of the present invention is placed before the input of the word match circuit 17, and by the idle word detection signal (IWD), the valid 16 (idle word retrieval output), which is the output of the valid cell 15, and the output of the word match line (data retrieval output) are switched and outputted to the word match circuit 17. Further, although the detection circuit (selecting circuit) 19 is shown as an independent circuit in FIG. 6, it may be integrated into the word match circuit 17.

Figure 7:
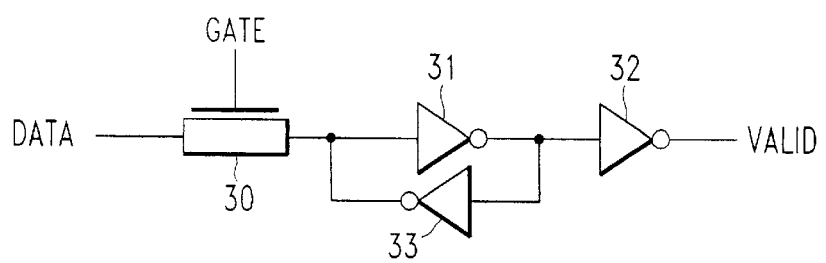
FIG. 7 is a diagram showing a valid cell of the present invention.

FIG. 7 is a diagram showing a configuration example of the valid cell 15. This valid cell can be commonly used for the CAMs of FIGS. 5 and 6. The valid cell of FIG. 7 utilizes the conventional latch circuit, and it comprises an N-type FET 30 and three invertors 31, 32, and 33. In operation, to write data to a certain word address, or to retrieve the data at that address, the input (DATA) and the gate (GATE) of the N-type FET 30 are asserted to "1" (high). Then, the output (VALID) through the two invertors 31 and 32 is set to "1" and simultaneously the output (VALID) of "1" is held by the invertors 31 and 33. To remove the data at that address from retrieval, "0" (low) is assigned to the input (DATA), and "1" (high) is assigned to the gate (GATE), thereby to set the output (VALID) to "0." Whereupon, the output (VALID) of "0" is latched by the invertors 31 and 33.

Figure 8:
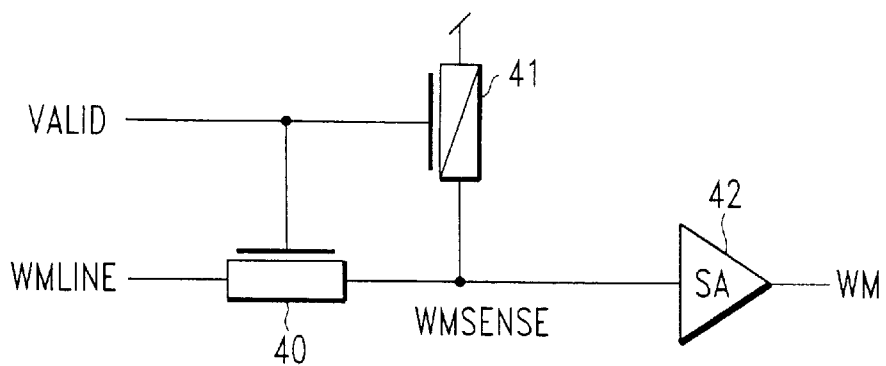
FIG. 8 is a diagram showing a configuration example of the word match circuit in the CAM of the present invention in FIG. 5.

FIG. 8 is a diagram showing a configuration example of the word match circuit 17 in the CAM of FIG. 5. The word match circuit of FIG. 8 comprises an N-type FET 40, P-type FET 41, and a sense amplifier (SA) 42. In the word match circuit, various sense methods can be employed depending on comparison methods on the basis of CAM cell and word address. The sense amplifier (SA) outputs "0" when the input is lower than a reference potential, and outputs "1" when the input is higher than the reference potential. The input (WMLINE) is a signal which becomes b "0"1 when there is a match between the inputted retrieval data and the data in the memory on a word address basis, and "1" when there is no match. For instance, when the valid (VALID) 16, the output of the valid cell, is "1," the N-type FET 40 turns on, and simultaneously the P-type FET 41 turns off. Then, the node (WMSENSE) is connected to the word match line (WMLINE), and a value corresponding to the signal on the word match line (WMLINE) is outputted to the word match (WM) by the sense amplifier (SA). When the valid (VALID) 16 is "0," that address is out of data retrieval, so the N-type FET 40 turns off, and simultaneously the P-type FET 41 turns on. Whereupon, the node (WMSENSE) and the word match line (WMLINE) are separated, the potential of the node (WMSENSE) becomes high, and "1" is outputted to the word match (WM).

Figure 9:
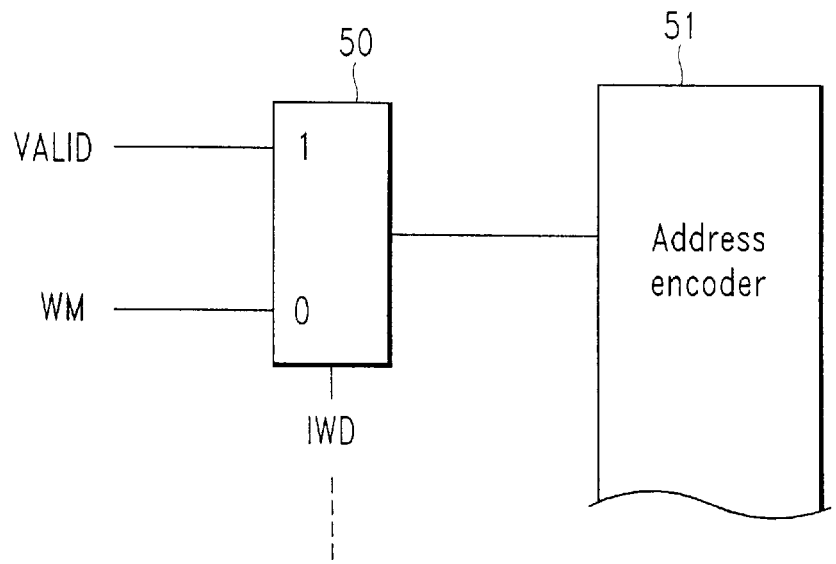
FIG. 9 is a diagram showing the detail of a first detection circuit of FIG. 5.

FIG. 9 is a diagram showing a more specific example of the detection circuit 19 in the first example of FIG. 5. In the example of FIG. 9, a selecting circuit 50 switches the word match output (WM) and the valid (VALID) in response to the idle word detection signal (IWD) of FIG. 8. That is, for the normal data retrieval, the idle word detection signal (IWD) becomes "0 (low)," and the word match output (WM) is outputted from the selecting circuit 50 to an address encoder 51. For the idle word detection, the idle word detection signal (IWD) becomes "1 (high)," and the valid (VALID) is outputted from the selecting circuit 50 to the address encoder 51.

Figure 10:
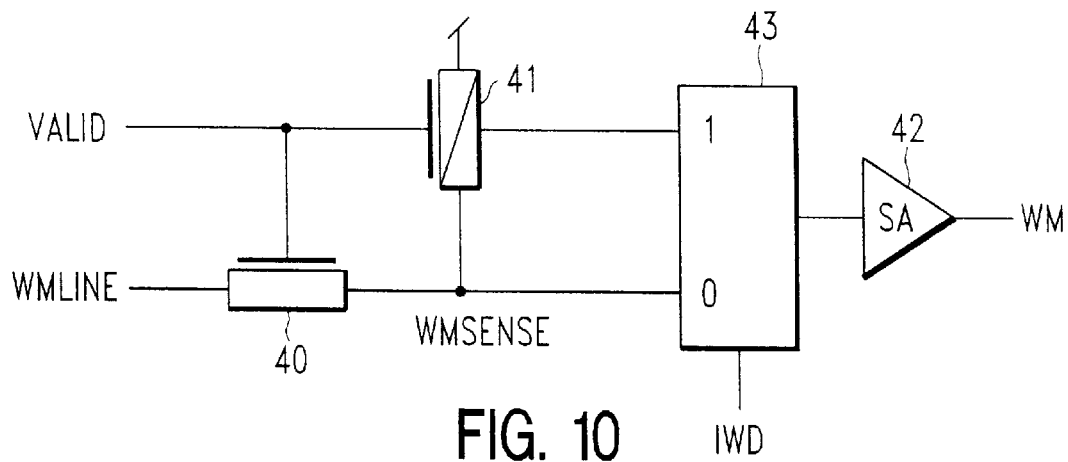
FIG. 10 is a diagram showing the detail of a second detection circuit of FIG. 6.

FIG. 10 is a diagram showing a more specific example of the detection circuit 19 in the second example of FIG. 6. The example of FIG. 10 is obtained by providing a selecting circuit 43 in the input stage of the sense amplifier 42 of the word match circuit of FIG. 8. The selecting circuit 43 switches the word match output (WM) and the valid output (VALID) in response to the idle word detection signal (IWD). That is, for the normal data retrieval, the idle word detection signal (IWD) becomes "0 (low)," and the word match output (WM) is outputted from the selecting circuit 43 to the sense amplifier (SA) 42. For the idle word detection, the idle word detection signal (IWD) becomes "1 (high)," and the valid cell output (VALID) is outputted from the selecting circuit 43 to the sense amplifier (SA) 42.

Figure 11:
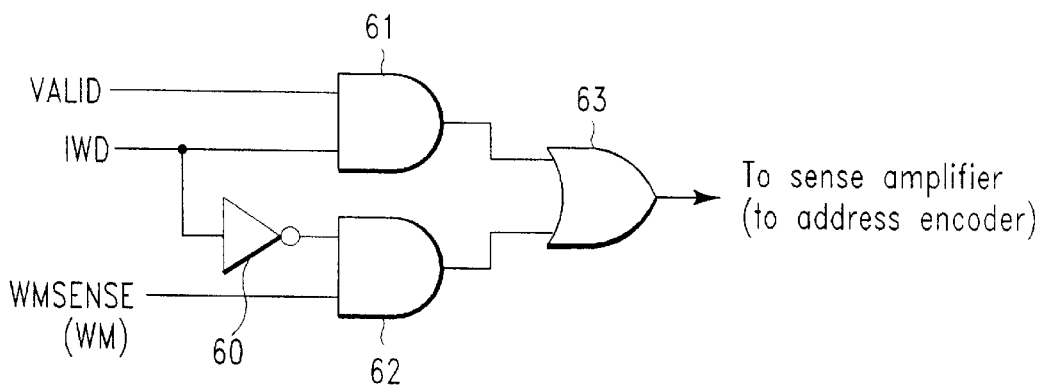
FIG. 11 is a diagram showing the detail of a selecting circuit of the present invention.
Figure 12:
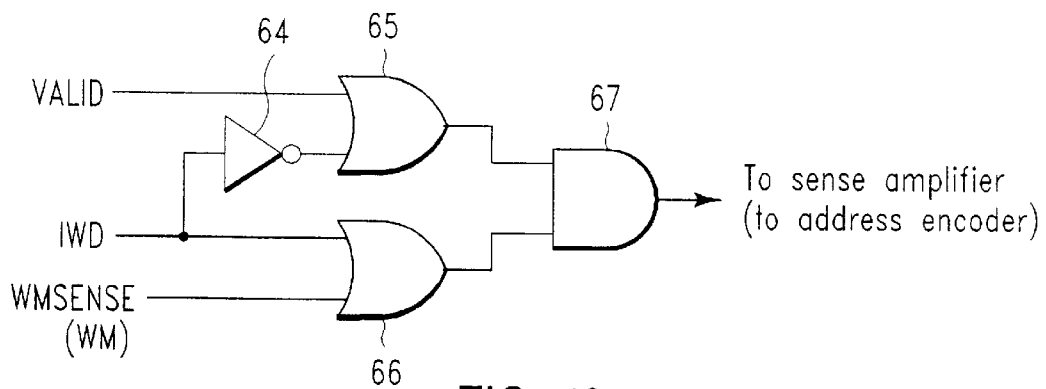
FIG. 12 is a diagram showing the detail of the selecting circuit of the present invention.
Figure 13:
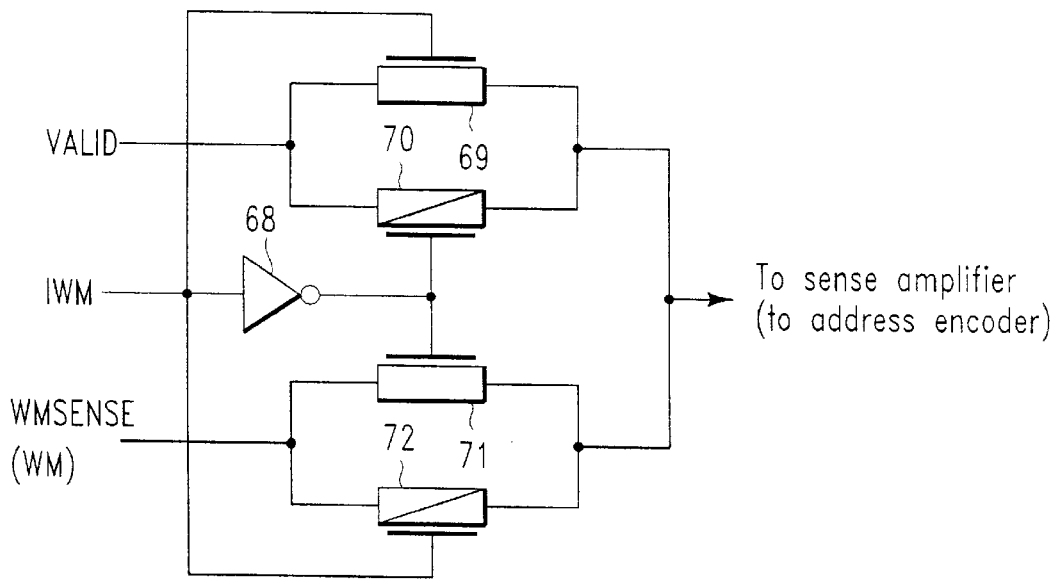
FIG. 13 is a diagram showing the detail of the selecting circuit of the present invention.

In FIGS. 11 to 13, the details (examples) of the selecting circuits 43 and 50 of the present invention are shown. The selecting circuit of FIG. 11 comprises an inverter 60, AND circuits 61 and 62, and an OR circuit 63. The selecting circuit of FIG. 12 comprises an inverter 64, OR circuits 65 and 66, and an AND circuit 67. FIG. 13 is a selecting circuit comprising an inverter 68, N-type FETs 69 and 71, and P-type FETs 70 and 72. In any configuration of FIGS. 11 to 13, if the idle word detection signal (IWD) is "0," the output of the selecting circuit becomes the word match line output (WMSENSE) or the word match output (WM) to perform the normal data retrieval. If the idle word detection signal (IWD) is "1," the output of the selecting circuit becomes the valid output (VALID) to enable the idle word retrieval to be performed.

Although the embodiments of the present invention have been described in detail based on the drawings, the present invention is not limited to the above mentioned embodiments. In addition, the present invention can be carried out in modes having experienced various improvements, corrections, and modifications based on the knowledge of those skilled in the art without departing from its purpose.

What is claimed is:

1. A detecting circuit of an idle word during write, read or no-operation for a content addressed memory having valid cells, comprising a unit for supplying the output of a valid cell to an address encoder in response to an idle word detection signal, said unit includes a selecting circuit provided between a word match circuit and an address encoder, said selecting circuit switching and outputting the output of the valid cell and the output of the word match circuit to the address encoder in response to the idle word detection signal.

2. The detecting circuit of an idle word according to claim 1, wherein said unit for supplying the output of a valid cell comprises a selecting circuit provided between the valid cells and a word match circuit, said selecting circuit switching and outputting the output of a valid cell and the output on a word match line to the word match circuit in response to the idle word detection signal.

3. The detecting circuit of an idle word according to claim 2, wherein said idle word detection signal is a search signal.

4. A content addressed memory (CAM) comprising:

content addressable memory cells;

valid cells;

word match lines;

a word match circuit;

an address encoder, and a circuit for detecting an idle word during write, read or no-operation by using the output of a valid cell, said circuit includes a selecting circuit provided between the word match circuit and the address encoder, said selecting circuit switching and outputting the output of the valid cell and the output of the word match circuit to the address encoder in response to an idle word detection signal.

5. The content addressed memory according to claim 4, wherein said circuit for detecting an idle word comprises a selecting circuit provided between the valid cells and the word match circuit, said selecting circuit switching and outputting the output of a valid cell and the output on a word match line to the word match circuit in response to an idle word detection signal.

6. The content addressed memory according to claim 5, wherein said idle word detection signal is a search signal.

7. A detection method for detecting an idle word for a content addressed memory having valid cells during a write, read or no-operation, comprising the steps of:

writing bit data representing the presence or absence of valid data to valid cells; and outputting the bit data of a valid cell to an address encoder in response to an idle word detection signal, which includes a step of switching and outputting the output of the valid cell and the output of a word match circuit to the address encoder in response to the idle word detection signal.

8. The detection method of an idle word according to claim 7, wherein said step of outputting the bit data output of a valid cell comprises a step of switching and outputting the output of the valid cell and the output on a word match line to the word match circuit in response to the idle word detection signal.

9. The detection method of an idle word according claim 8, wherein said idle word detection signal is a search signal.

* * * * *